(12) United States Patent
Wang et al.

(10) Patent No.: US 8,787,038 B2
(45) Date of Patent: Jul. 22, 2014

(54) CHASSIS FOR ELECTRONIC DEVICE

(75) Inventors: Jun-Wei Wang, Shenzhen (CN); Qiang Chai, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/562,529

(22) Filed: Jul. 31, 2012

(65) Prior Publication Data

US 2013/0141887 A1 Jun. 6, 2013

(30) Foreign Application Priority Data

Dec. 2, 2011 (CN) ...................... 2011 2 0494720.X

(51) Int. Cl.
*H05K 9/00* (2006.01)
*H04B 10/00* (2013.01)

(52) U.S. Cl.
CPC . *H05K 9/00* (2013.01); *H04B 10/00* (2013.01)
USPC ....... 361/818; 174/350; 361/816; 361/679.02

(58) Field of Classification Search
USPC .................................................. 361/816, 818
See application file for complete search history.

(56) References Cited

U.S. PATENT DOCUMENTS

| 5,565,656 | A | * | 10/1996 | Mottahed ...................... 174/372 |
| 5,783,771 | A | * | 7/1998 | Copeland et al. ............. 174/365 |
| 6,444,901 | B1 | * | 9/2002 | Bryant ......................... 174/377 |
| 6,538,903 | B1 | * | 3/2003 | Radu et al. ................... 361/818 |
| 7,570,496 | B2 | * | 8/2009 | Chen et al. ................... 361/818 |
| 8,264,848 | B2 | * | 9/2012 | Malo et al. ................... 361/761 |

* cited by examiner

*Primary Examiner* — Zachary M Pape
*Assistant Examiner* — Douglas Burtner
(74) *Attorney, Agent, or Firm* — Novak Druce Connolly Bove + Quigg LLP

(57) ABSTRACT

A chassis for an electronic device includes a main housing and a removable cover. The main housing includes a base plate and two opposite side plates integrally formed together. The removable cover includes a main portion and two opposite side portions. The side portions are latched on the side plates. A space is defined between each side portion of the cover and each side plates of the main housing. A waveguide is formed between each side portion and each side plate to attenuate electromagnetic radiation in the space.

1 Claim, 4 Drawing Sheets

CHASSIS FOR ELECTRONIC DEVICE

BACKGROUND

1. Technical Field

The present disclosure generally relates to a chassis for electronic device (e.g. computer, server) which has lower electromagnetic radiation emission.

2. Description of Related Art

Electronic components in a computer/server chassis emit electromagnetic radiation. Referring to FIG. 4, the computer chassis is usually made of a main housing 40 and a removable cover 50 engaging with each other. Spaces 45 inevitably exist at junctions of opposite sides of the cover 50 and the main housing 40. High electromagnetic radiation of the electronic components leaks from the space 45, greatly affecting the radiation emission value of the computer/server chassis.

Therefore, there is room for improvement within the art.

BRIEF DESCRIPTION OF THE DRAWINGS

Many aspects of the chassis for electronic device can be better understood with reference to the following drawings. The components in the drawings are not necessarily to scale, the emphasis instead being placed upon clearly illustrating the chassis for electronic device. Moreover, in the drawings, like reference numerals designate corresponding parts throughout the several views.

DETAILED DESCRIPTION

Figure 1:
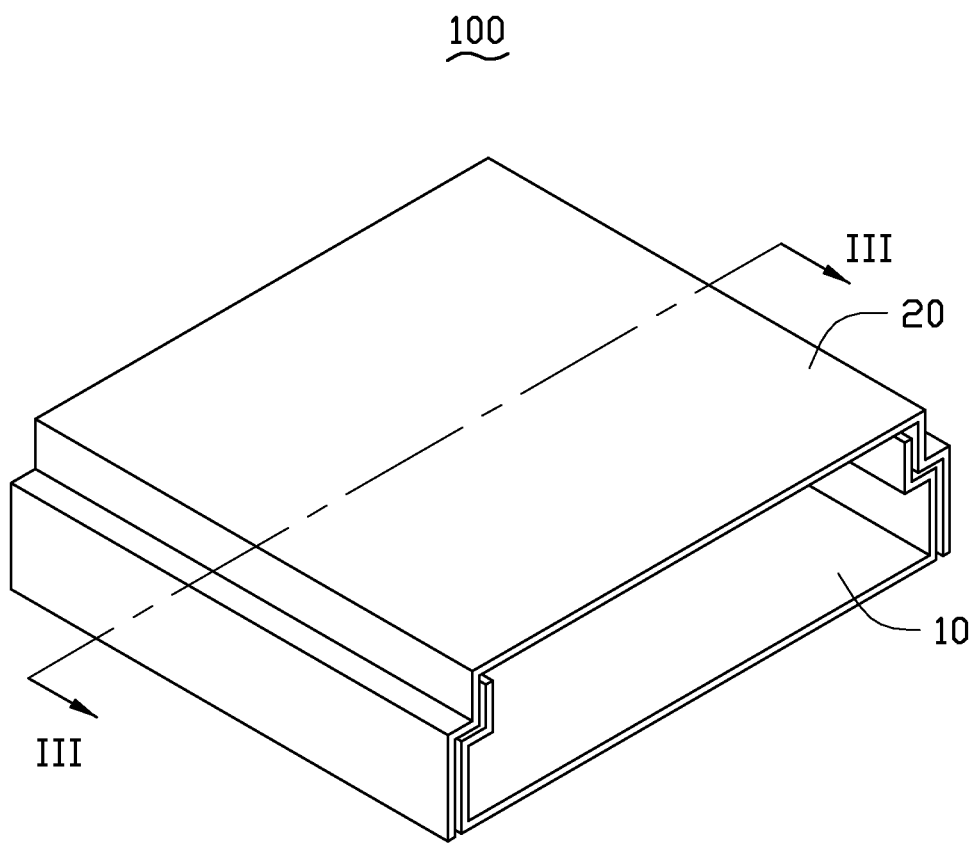
FIG. 1 is an isometric view of a chassis for electronic device according to an exemplary embodiment.

FIG. 1 shows an exemplary embodiment of a computer chassis 100. The computer chassis 100 includes a main housing 10 and a removable cover 20. A hard disk, a motherboard, and other electronic components (not shown) are assembled in the chassis 100.

Figure 2:
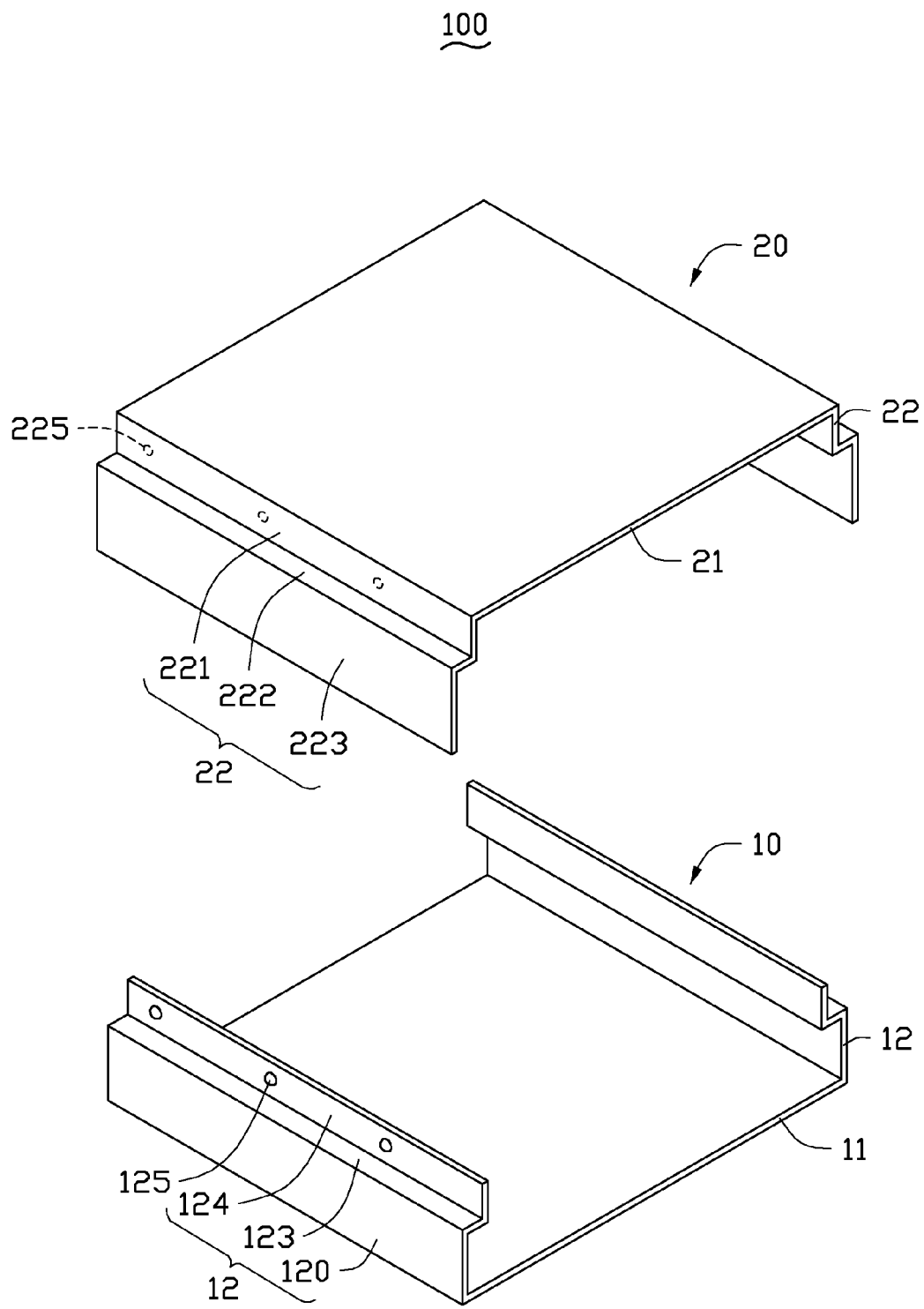
FIG. 2 is an exploded view of the chassis for electronic device shown in FIG. 1.
Figure 3:
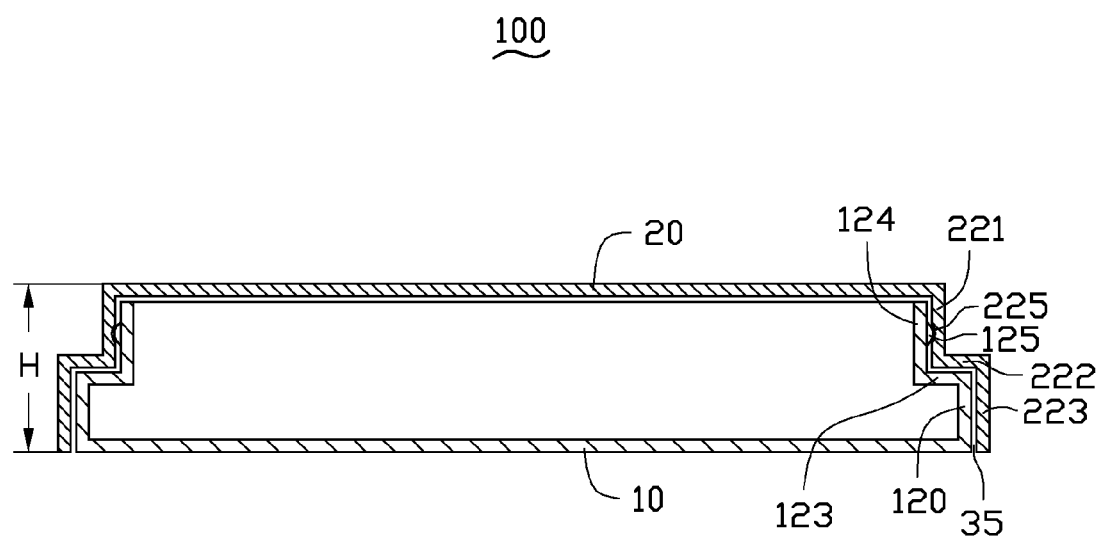
FIG. 3 is a cross-sectional view of the chassis for electronic device shown in FIG. 1 taken along line III-III.
Figure 4:
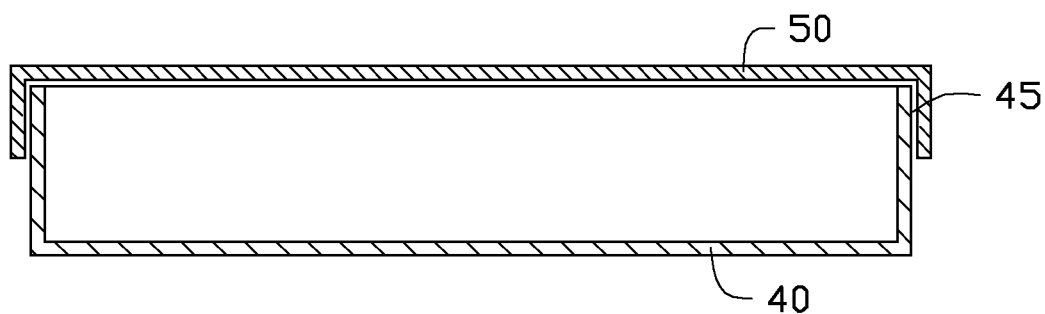
FIG. 4 is a cross-section view of a conventional chassis.

FIGS. 2 and 3, show the main housing 10 of the embodiment. The main housing 10 includes a base plate 11 and two opposite side plates 12 integrally formed together. Each side plate 12 includes a first extending plate 120, a connecting plate 123 and a second extending plate 124. The first extending plate 120 perpendicularly extends from one end of the base plate 11. The connecting plate 123 perpendicularly extends from a distal end of the first extending plate 120, and is parallel with the base plate 11. The second extending plate 124 perpendicularly extends from the connecting plate 123, and is parallel with the first extending plate 120. Thus, each side plate 12 has a stepped construction. A number of projections 125 are formed on the second extending plate 124 for abutting against the cover 20.

The shape of the cover 20 is similar to the main housing 10. The cover 20 includes a main portion 21 and two opposite side portions 22. The length of each side portion 22 is substantially the same as each side plate 12. Each side portion 22 includes a first sidewall 221, a connecting sidewall 222 and a second sidewall 223. The first sidewall 221 perpendicularly extends from one end of the main portion 21. The connecting sidewall 222 perpendicularly extends from a distal end of the first sidewall 221, and is parallel with the main portion 21. The second sidewall 223 perpendicularly extends from the connecting sidewall 222, and is parallel with the first sidewall 221. Thus, each side portion 22 has a stepped construction. A number of grooves 225 are defined in an inside of the second sidewall 223 for receiving the projections 125 of the main housing 10.

In assembling of the computer chassis 100, the cover 20 is attached to the main housing 10. The first sidewall 221 covers the second extending plate 124. The connecting sidewall 222 covers the connecting plate 123. The second sidewall 223 covers the first extending plate 120. The projections 125 latch in the grooves 225 for latching the cover 20 on the housing 10.

A space 35 is defined between each side portion 22 of the cover 20 and each side plate 12 of the main housing 10. An "H" represents the height of the space 35. Comparing to the conventional chassis, since the length of each side portion 22 is added, the height "H" of the space 35 is added. Thus, a waveguide is formed between each side portion 22 and each side plate 12. The waveguide will allow high electromagnetic radiation of the electronic components to be attenuated in the space 35. Thus, the radiation emission value of the computer chassis is greatly reduced. Additionally, the stepped construction of the cover 20 and the main housing 10 allows the length of the waveguide to be increased. Thus, the electromagnetic radiation can be sufficiently attenuated in the space 35.

It is to be understood, however, that even through numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A chassis for an electronic device, comprising:
a main housing including a base plate and two opposite side plates integrally formed together, wherein each side plate includes a first extending plate, a connecting plate and a second extending plate having equal thicknesses, the first extending plate perpendicularly extends from one end of the base plate, the connecting plate perpendicularly extends from a distal end of the first extending plate, and is parallel with the base plate, and the second extending plate perpendicularly extends from the connecting plate, and is parallel with the first extending plate;
a removable cover including a main portion and two opposite side portions, the side portions latched on the side plates, a space defined between each side portion of the cover and each side plate of the main housing, wherein each side portion includes a first sidewall, a connecting sidewall and a second sidewall having equal thicknesses, each first sidewall perpendicularly extends from one end of the main portion, the connecting sidewall perpendicularly extends from a distal end of the first sidewall, and is parallel with the main portion, the second sidewall perpendicularly extends from the connecting sidewall, and is parallel with the first sidewall, the first sidewall is spaced from the second extending plate, the connecting sidewall is spaced from the connecting plate, and the second sidewall is spaces from the first extending plate;
wherein a plurality of projections are formed on the second extending plate, a plurality of grooves are defined in an inside of the second sidewall for receiving the projections, a waveguide is formed between the first sidewall, the connecting sidewall and the second sidewall of each side portion and the first extending plate, the connecting plate and the second extending plate of each side plate to attenuate electromagnetic radiation produced in the space.

* * * * *